United States Patent [19]

Kamiya et al.

[11] Patent Number: 5,122,847
[45] Date of Patent: Jun. 16, 1992

[54] NON-VOLATILE SEMICONDUCTOR MEMORY WITH CVD TUNNEL OXIDE

[75] Inventors: Masaaki Kamiya; Yukihiro Imura; Katsuyuki Takahashi, all of Tokyo, Japan

[73] Assignee: Seiko Instruments & Electronics Ltd., Japan

[21] Appl. No.: 241,752

[22] Filed: Sep. 7, 1988

Related U.S. Application Data

[63] Continuation of Ser. No. 905,924, Sep. 10, 1986, abandoned.

[51] Int. Cl.$^5$ .................. H01L 29/68; H01L 29/94
[52] U.S. Cl. ........................ 357/23.5; 357/6; 437/238
[58] Field of Search ............ 357/6, 23.5; 437/238

[56] References Cited

U.S. PATENT DOCUMENTS

| | | | |
|---|---|---|---|
| 4,002,512 | 1/1977 | Lim | 437/238 |
| 4,288,863 | 9/1981 | Adam | 357/23.5 |
| 4,535,349 | 8/1985 | Weinberg | 357/6 |
| 4,688,078 | 8/1987 | Hsieh | 357/23.15 |

FOREIGN PATENT DOCUMENTS

| | | |
|---|---|---|
| 0002997 | 7/1979 | European Pat. Off. |
| 0035160 | 9/1981 | European Pat. Off. |
| 0105802 | 9/1983 | European Pat. Off. |
| 2041645 | 9/1980 | United Kingdom ........ 357/23.5 |

OTHER PUBLICATIONS

Sze, *Semiconductor Devices, Physics and Technology* Wiley, N.Y., N.Y. 30 Apr. 1985 pp. 357–358.
Kuiper et al "Interface Tech." pp. 116–120 *Insul. Films on Semiconductors* 1983 Elsevier, Holland.
Peek "The Character . . . , EEPROM" pp. 261–265 *Insul. Films on Semiconductors* 1983 Elsevier, Holland.
Ged et al "Highly Uniform . . . Etching" pp. 181–183 *Insul. Films on Semi.* 1983 Elsevier, Holland.

*Primary Examiner*—Jerome Jackson, Jr.
*Attorney, Agent, or Firm*—Bruce L. Adams; Van C. Wilks

[57] ABSTRACT

A non-volatile semiconductor memory device is comprised of a floating gate electrode disposed on and electrically insulated from a semiconductor substrate for storing electric charge. A tunnel insulating film is disposed in contact with the floating gate electrode to inject and extract the electric charge to and from the floating gate electrode in the form of an electric tunnel current flowing through the tunnel insulating film. The tunnel insulating film is composed of silicon oxide chemically-vapor-deposited at a temperature between 700° C. and 900° C. from the vapor mixture of dichlorosilane and dinitrogen monoxide on the order of 100 Å thickness to thereby establish a breakdown current density more than 1.0 A/cm$^2$.

13 Claims, 3 Drawing Sheets

5 CVD INSULATOR FILM

15 THERMALLY OXIDIZED

NON-VOLATILE SEMICONDUCTOR MEMORY WITH CVD TUNNEL OXIDE

This is a continuation of application Ser. No. 905,924, filed Sept. 10, 1986, now abandoned.

BACKGROUND OF THE INVENTION

The present invention provides a floating gate type EEPROM which employs a CVD insulator film as a tunnel oxide film through which electric charge is transferred between a floating gate electrode and another electrode, thereby enabling larger number of times of writing and erasing operations than that in the case of a conventional floating gate type EEPROM which employs a thermally oxidized film as the tunnel oxide film.

1. Field of the Invention

The present invention relates to an electrically erasable and programmable floating gate type non-volatile semiconductor memory which enables electrical writing and erasing operation to be readily effected.

2. Description of the Prior Art

The prior art shows at least, a floating gate type EEPROM, for example, the following patent U.S. Pat. No. 4,203,158 — Dov. Frohman-Bentchkowsky. et al. —May 13, 1980.

FIG. 2 is a sectional view of a conventional floating gate type EEPROM. On the surface of the P-type semiconductor substrate 11, there are provided the N+type source area 12 and the drain area 13, above which is provided the oxidized gate film 14. In the small are adjacent to the drain area 13, there is provided the thin oxidized film 15, above which are provided the floating gate electrode 16, the second oxidized gate film 17 and the control gate electrode 18. Writing operation is conducted by applying a writing voltage to the control gate electrode 18, so that the electrons are injected from the drain area 13 into the floating gate electrode 16 through the thin oxidized film 15. Erasing operation is conducted by applying an erasing voltage to the control gate electrode 18, so that the electrons are extracted from the floating gate electrode 16 into the drain area 13 through the thin oxidized film 15. Writing and erasing operations in the floating gate type EEPROM are effected by means of Fowler-Nordheim tunnel current flowing through a thin oxide film (100 to 150Å). This thin oxide film for writing and erasing operations has heretofore been constituted by a thermally oxidized film.

The thermally oxidized film 15 conventionally employed for writing and erasing has, however, the disadvantage that breakdown occurs when the number of times of writing and erasing operations reaches about $10^4$.

SUMMARY OF THE INVENTION

To solve the above-described problem, the present invention employs a CVD insulator film as an insulator film for writing and erasing operations in place of the thermally oxidized film. It has heretofore been considered that CVD insulator film is inferior to thermally oxidized film in terms of characteristics, e.g., a lower density and a larger leakage current. However, it has been found that a CVD oxide film which is formed at a high temperature, i.e., 700° C. or higher, has superior characteristics to those of thermally, oxidized film.

More specifically, such a CVD insulator film exhibits excellent characteristics when used as a thin insulation film on the order of 100Å, namely, the CVD insulator film has a large breakdown current density and is not readily broken down in contrast to the thermally oxidized film. Thus, the present invention employs this CVD insulator film as a tunnel insulator film.

The CVD insulator film as an insulator film for writing and erasing in a floating gate type EEPROM as described above enables the EEPROM to carry out an increased number of times of writing and erasing operations, i.e., about $10^6$, which is more than 100 times that in the case of the prior art EEPROM.

DETAILED DESCRIPTION OF THE PREFERRED EMBODIMENT

Figure 1:
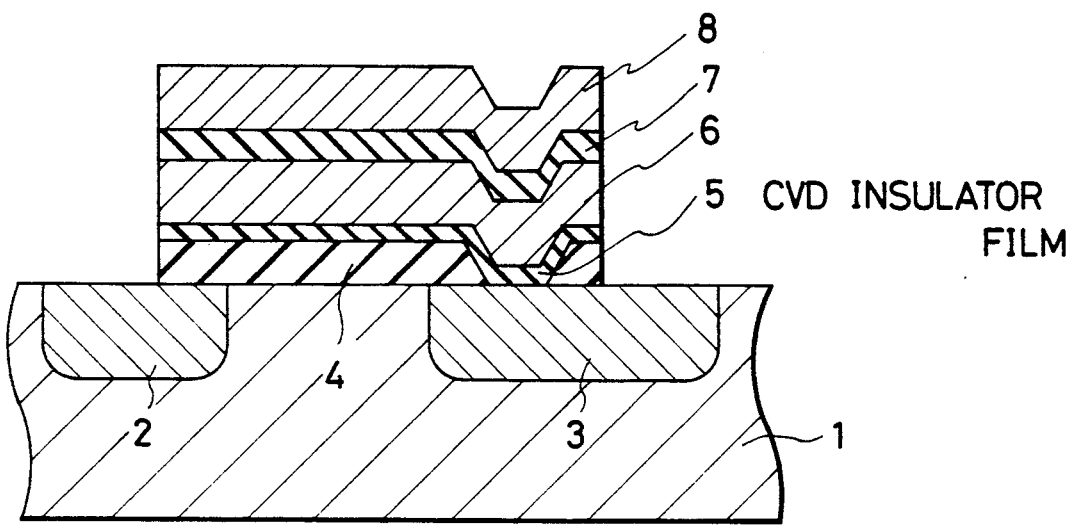
FIG. 1 is a sectional view of floating gate type EEPROM in accordance with a first embodiment of the present invention.
Figure 2:
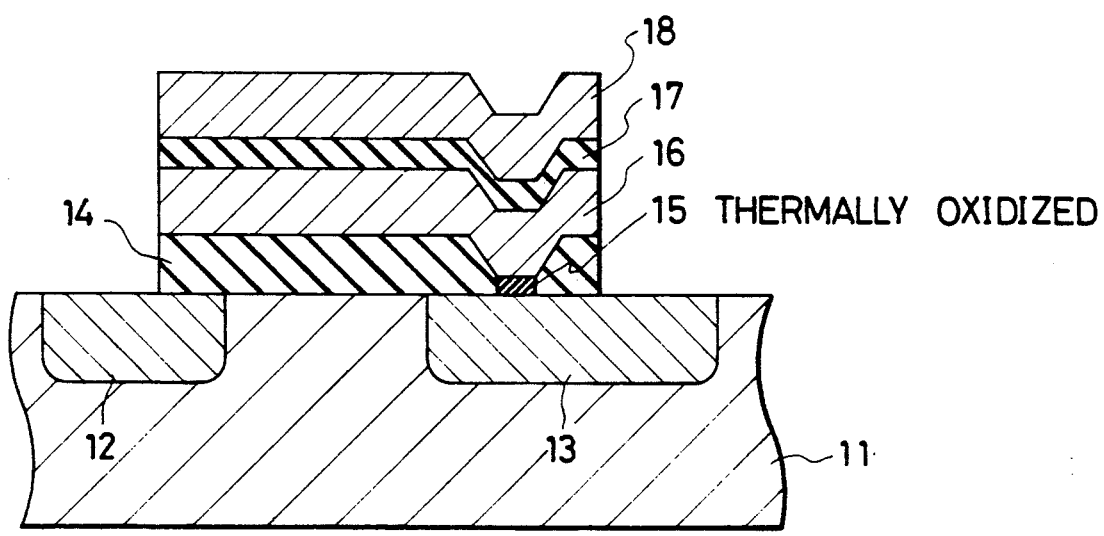
FIG. 2 is a sectional view of a conventional floating gate type EEPROM.

The present invention will be described hereinunder by way of embodiments thereof. FIG. 1 is a sectional view of a floating gate type EEPROM in accordance with a first embodiment of the present invention.

On the surface of a P-type semiconductor substrate 1, N+-type source region 2 and N+-type drain region 3 are formed in spaced relation, and a first insulating film in the form of a gate oxide film 4 is provided thereon. A tunnel insulating film in the form of a chemically-vapor-deposited or CVD insulator film 5 of 100Å thickness is provided on a small region in contact with the drain region 3 and a floating gate electrode 6, a second insulating film in the form of a gate oxide film 7 and a control gate electrode 8 are provided in that order on the CVD insulator film 5.

Writing operation is conducted by applying a writing voltage to the control gate electrode 8, so that the electrons are injected from the drain region 3 into the floating gate electrode 6 in the form of a tunnel current flowing through the CVD insulating film 5.

Erasing operation is conducted by applying an erasing voltage to the control gate electrode 8, so that the electrons are extracted from the floating gate electrode 6 into the drain region 3 through the CVD insulation film 5.

The CVD insulator film 5 is formed in such a manner that the vapor mixture of dischlorosilane ($SiH_2Cl_2$) and nitrous oxide or dinitrogen monoxide ($N_2O$) is employed and a silicone moxide film is formed as a single layer under a vacuum at a temperature of 700° to 900° C. This single-layered CVD insulator film 5 exhibits excellent characteristics as a thin insulating film on the order of 100Å, namely, it has a single-layered large breakdown current density and is not readily broken down in contrast to the thermally oxidized film 15. It is therefore possible to greatly increase the number of times of available writing and erasing operations.

It should be noted that, although CVD oxide film is employed as the CVD insulator film 5 in this embodiment, CVD oxide film is not necessarily limitative.

Figure 4:
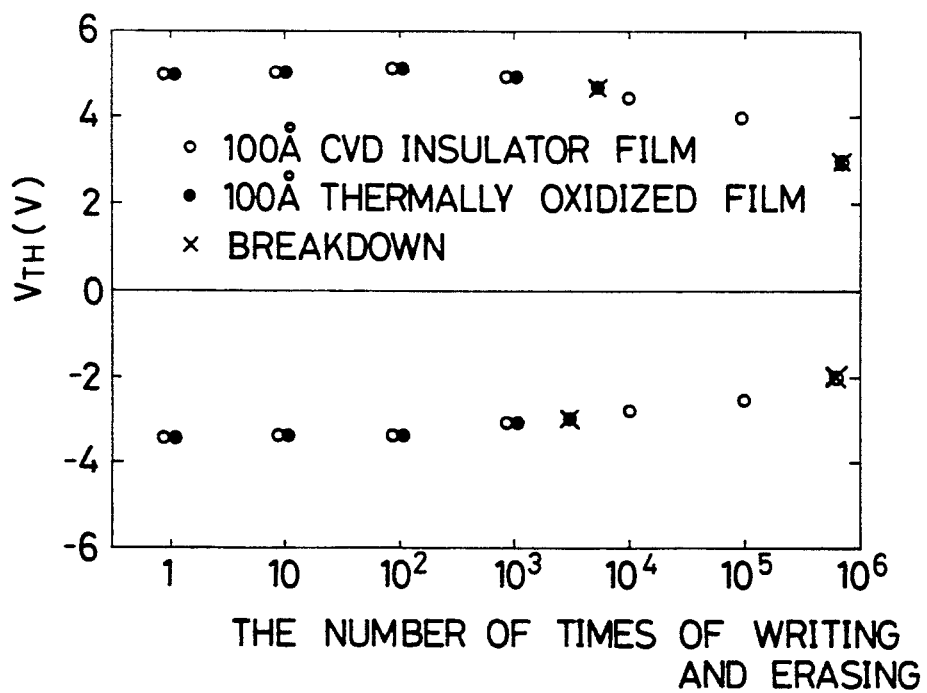
FIG. 4 shows the respective rewriting characteristics of the EEPROM according to the present invention which employs a CVD insulator film and the conventional EEPROM which employs a thermally oxidized film.

FIG. 4 shows the respective rewriting characteristics of the floating gate type EEPROM in accordance with the first embodiment which employs a CVD insulator film and the conventional EEPROM which employs a thermally oxidized film. In the graph shown in FIG. 4, the number of times of writing and erasing operations is plotted along the axis of abscissas and the voltage value ($V_{TH}$) is plotted along the axis of ordinates. It will be understood from FIG. 4 that the EEPROM which employs the CVD insulator film 5 is relatively durable and breaks down when the number of times of writing and erasing operations reaches about $10^6$, whereas the EEPROM which employs the thermally oxidized film 15 breaks down when the number of times of writing and erasing operations reached about $10^4$. The EEPROM according to the present invention has less change in the voltage value and therefore exhibits high reliability.

Figure 5:
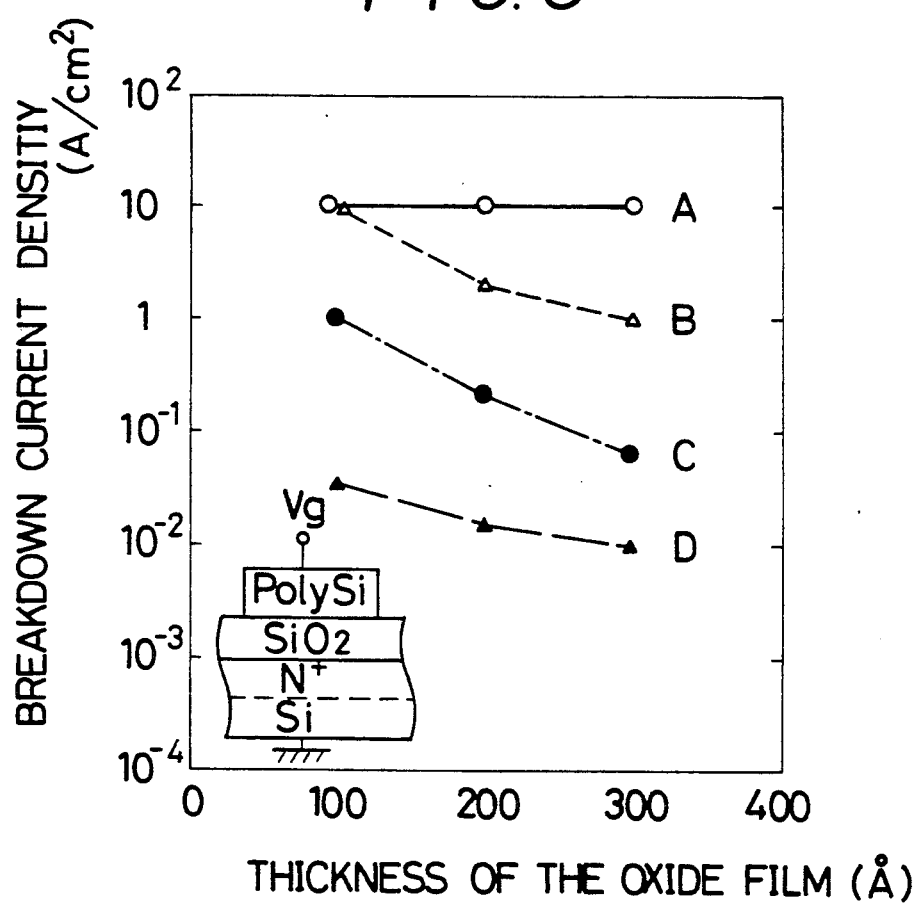
FIG. 5 shows the respective breakdown current densities of the CVD insulator film and the thermally oxidized film.

The reason for this will be explained below. FIG. 5 shows the respective breakdown current densities of the CVD insulator film 5 and the thermally oxidized film 15. In the graph shown in FIG. 5, the thickness of the oxide films is plotted along the axis of abscissas and the breakdown current ,density is plotted along the axis of ordinates. In FIG. 5 the marks means as follows;

○ ... breakdown current A of the CVD insulator film 5 when the gate voltage $V_g$ is positive.
△ ... breakdown current B of the CVD insulator film 5 when the gate voltage $V_g$ is negative.
● ... breakdown current C of the thermally oxidized film 15 when the gate voltage $V_g$ is positive.
▲ ... breakdown current D of the thermally oxidized film 15 when the gate voltage $V_g$ is negative.

It will be understood from FIG. 5 that the CVD insulator film 5 exhibits a larger breakdown current density than that of the thermally oxidized film 15. Accordingly, the CVD insulator film 5 enables the number of times of available writing and erasing operations increased by a large margin in contrast to the thermally oxidized film 15.

Figure 3:
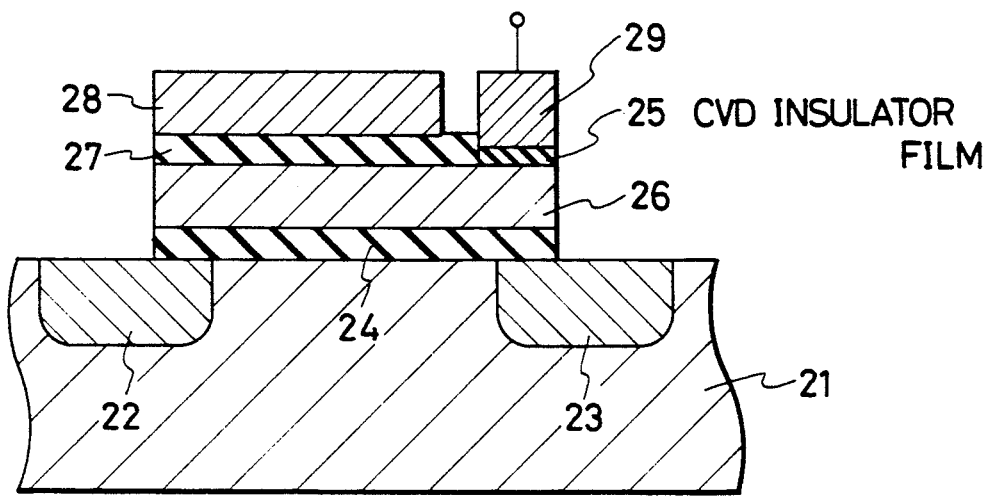
FIG. 3 is a sectional view of a floating gate type EEPROM in accordance with a second embodiment of the present invention.

FIG.3 is a sectional view of a floating gate type EEPROM in accordance with a second embodiment of the present invention.

On the surface of a P-type semiconductor substrate 21, $N^+$-type source and drain regions 22, 23 are formed, and a first gate oxide film 24 and a floating gate electrode 26 are provided over the space between the source and drain regions 22 and 23. In addition, a Second gate oxide film 27 and a control gate electrode 28 are provided on the left-hand portion of the floating gate electrode 26, while a CVD insulator film 25 of 100Å thickness and an electrode 29 are provided on the exposed right-hand portion of the floating gate electrode 26. The electrode 29 is electrically connected to the floating gate electrode to transfer electric charge between the electrode 29 and the floating gate electrode 26. Writing operation is conducted by applying a writing voltage to the control gate electrode 28 opposite to the writing and erasing electrode 29, so that the electrons are injected from the writing and erasing electrode 29 into the floating gate electrode 26 through the CVD insulator film 25. Erasing operation is conducted by applying an erasing voltage to the control gate electrode 28, so that the electrons stored in the floating gate electrode 26 are extracted from the floating gate electrode 26 into the writing and erasing electrode 29 through the CVD insulating film 25.

In this embodiment, the floating gate electrode 26 below the CVD insulator film 25 can be formed of polycrystalline silicon. In such case also, the EEPROM which employs the CVD insulator film 25 enables the number, of times of available writing and erasing operations to be increased by a large margin as compared with the conventional EEPROM which employs the thermally oxidized film, in a manner similar to that in the case of the first embodiment.

As will be clearly understood from the above description, the present invention employs the CVD insulator film 5 as a tunnel insulating film of a floating gate type EEPROM and thereby offers the advantage that the number of times of available writing and erasing operations can be increased so as to be about 100 times that in the case of the prior art EEPROM which employs the thermally oxidized film 15. Accordingly, the present invention can provide a highly reliable floating gate type EEPROM.

What is claimed is:

1. A non-volatile semiconductor memory comprising:
a semiconductor substrate of one conductivity type;
source and drain regions formed in a surface portion of the semiconductor substrate in spaced relation to one another, the source and drain regions being of another conductivity type opposite to that of the semiconductor substrate;
a floating gate electrode disposed above and insulated from the semiconductor substrate surface;
a first insulating film for electrically insulating the floating gate electrode from the semiconductor substrate;
a tunnel insulating film of thickness less than 200 angstroms disposed on a top portion of the floating gate electrode, the tunnel insulating film being comprised of a single chemical-vapor-deposited film layer formed at a temperature above 700° C;
an electrode disposed on top of the tunnel insulating film to effect transfer of electric charge between the electrode and the floating gate electrode through the tunnel insulating film due to the tunnel effect;
a control gate electrode electrically insulated from the floating gate electrode; and
a second insulating film disposed between the control gate electrode and the floating gate electrode.

2. A non-volatile semiconductor memory as claimed in claim 1, wherein the tunnel insulating film is comprised of an oxide film.

3. A non-volatile semiconductor memory as claimed in claim 2; wherein the oxide film is formed by chemical reaction of dichlorosilane ($SiH_2Cl_2$) and dinitrogen monoxide ($N_2O$).

4. A non-volatile semiconductor memory as claimed in claim 2; wherein the oxide film is formed by low pressure chemical vapor deposition at a temperature in the range of 700° C. to 900° C.

5. A non-volatile semiconductor memory as claimed in claim 1; wherein the tunnel insulating film has a thickness of approximately 100Å.

6. A nonvolatile semiconductor memory as claimed in claim 1; wherein the tunnel insulating film comprises a silicon oxide film obtained by chemical vapor deposition from dichlorosilane and dinitrogen monoxide.

7. A non-volatile semiconductor memory device comprising: a semiconductor substrate of one electro-conductivity type; means defining source and drain regions of another electro-conductivity type in spaced relation to each other in a surface portion of the semiconductor substrate; a floating gate electrode having opposed upper and lower major surfaces and being disposed over a surface of the semiconductor substrate between the source and drain regions for storing electric charge in the floating gate electrode; a first insulating film interposed between the surface of the semiconductor substrate and the lower major surface of the floating gate electrode for electrically insulating the floating gate electrode from the semiconductor substrate; a second insulating film disposed on the upper major surface of the floating gate electrode; a control gate electrode disposed on and electrically insulated from the floating gate electrode through the second insulating film for applying a control voltage to the floating gate electrode; a tunnel insulating film of thickness less than 200 angstroms disposed in contact with a portion of the upper major surface of the floating gate electrode, the tunnel insulating film being comprised of a single chemical-vapor-deposited film layer having a breakdown current density greater than $1.0 \text{ A/cm}^2$; and injecting and extracting means including an electrode disposed in contact with the tunnel insulating film for injecting and extracting electric charge into and from the floating gate electrode in the form of a tunnel electric current flowing through the tunnel insulating film without causing breakdown thereof in response to the control voltage applied to the floating gate electrode.

8. A non-volatile semiconductor memory device as claimed in claim 7; wherein the chemically-vapor-deposited film has a thickness on the order of 100 Å.

9. A non-volatile semiconductor memory device as claimed in claim 7; wherein the chemically-vapor-deposited film is comprised of oxide film.

10. A non-volatile semiconductor memory device as claimed in claim 9; wherein the oxide film is comprised of a silicon oxide film.

11. A non-volatile semiconductor memory device as claimed in claim 10, wherein the silicon oxide film is composed of silicon oxide grown at a temperature more than 700° C.

12. A non-volatile semiconductor memory device as claimed in claim 11; wherein the silicon oxide film is composed of silicon oxide grown at a temperature less than 900° C.

13. A non-volatile semiconductor memory device as claimed in claim 11; wherein the silicon oxide film is composed of silicon oxide grown from the vapor mixture of dichlorosilane and dinitrogen monoxide.

* * * * *